(12) United States Patent
Huang

(10) Patent No.: US 9,484,330 B2
(45) Date of Patent: Nov. 1, 2016

(54) LIGHT-EMITTING DEVICE

(71) Applicant: PlayNitride Inc., Tainan (TW)

(72) Inventor: Shao-Hua Huang, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/822,898

(22) Filed: Aug. 10, 2015

(65) Prior Publication Data

US 2016/0126225 A1    May 5, 2016

(30) Foreign Application Priority Data

Nov. 4, 2014    (TW) .............................. 103138187 A

(51) Int. Cl.
| | |
|---|---|
| H01L 25/075 | (2006.01) |
| H01L 27/15 | (2006.01) |
| H01L 33/38 | (2010.01) |
| H01L 33/62 | (2010.01) |
| H01L 33/44 | (2010.01) |

(52) U.S. Cl.
CPC ......... *H01L 25/0753* (2013.01); *H01L 27/156* (2013.01); *H01L 33/382* (2013.01); *H01L 33/44* (2013.01); *H01L 33/62* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 9,252,332 B1* | 2/2016 | Kuo | ....................... | H01L 33/382 |
| 2011/0156064 A1* | 6/2011 | Seo | ..................... | H01L 25/0753 |
| | | | | 257/88 |
| 2011/0233587 A1* | 9/2011 | Unno | ..................... | H01L 33/382 |
| | | | | 257/98 |
| 2012/0086026 A1* | 4/2012 | Engl | ..................... | H01L 27/156 |
| | | | | 257/93 |
| 2012/0193657 A1* | 8/2012 | von Malm | ............ | H01L 27/153 |
| | | | | 257/89 |
| 2014/0151724 A1* | 6/2014 | Herrmann | ............... | H01L 24/19 |
| | | | | 257/88 |
| 2014/0160754 A1* | 6/2014 | Lee | ..................... | H01L 25/0753 |
| | | | | 362/237 |
| 2014/0319534 A1* | 10/2014 | Miyachi | .................. | H01L 33/44 |
| | | | | 257/76 |
| 2015/0144870 A1* | 5/2015 | An | ....................... | H01L 33/382 |
| | | | | 257/13 |

FOREIGN PATENT DOCUMENTS

| | | | | |
|---|---|---|---|---|
| DE | WO 2015074900 A1 * | 5/2015 | ........... | H01L 25/167 |
| JP | EP 2897167 A1 * | 7/2015 | ............ | H01L 33/08 |
| WO | 2014017871 | 1/2014 | | |

OTHER PUBLICATIONS

"Office Action of Taiwan Counterpart Application," issued on Jun. 2, 2016, p. 1-p. 6.

* cited by examiner

*Primary Examiner* — William Coleman
*Assistant Examiner* — Kien Ly
(74) *Attorney, Agent, or Firm* — Jianq Chyun IP Office

(57) ABSTRACT

A light-emitting device includes light-emitting units and an electrical connection layer. Each light-emitting unit includes a light-emitting stacking layer, a first electrode layer, an insulation layer, and a second electrode layer. The light-emitting stacking layer includes first and second-type doped semiconductor layers, an active layer, and a first inner opening passing through the second-type doped semiconductor layer and the active layer. The second electrode layer is close to and is electrically connected to the second-type doped semiconductor layer. The insulation layer is disposed on a sidewall of the first inner opening and forms a second inner opening. The first electrode layer is disposed in the second inner opening and electrically connected to the first-type doped semiconductor layer. The electrical connection layer is electrically connected to the first electrode layer of one of two adjacent light-emitting units and the second electrode layer of the other adjacent light-emitting unit.

11 Claims, 2 Drawing Sheets

LIGHT-EMITTING DEVICE

CROSS-REFERENCE TO RELATED APPLICATION

This application claims the priority benefit of Taiwan application serial no. 103138187, filed on Nov. 4, 2014. The entirety of the above-mentioned patent application is hereby incorporated by reference herein and made a part of this specification.

FIELD OF THE INVENTION

The invention relates to an optical device, and more particularly, to a light-emitting device characterized by favorable electrical connectivity.

DESCRIPTION OF RELATED ART

Thanks to numerous advantages of long life span, small size, high vibration and shock resistance, low heat emissivity, economical power consumption, and so on, solid light sources, e.g., light-emitting diodes (LEDs), have been widely applied as the light sources in a variety of household electric appliances and instruments. In recent years, the LEDs featuring economic power consumption and environmental protection have been further applied to road lighting, large outdoor billboards, traffic signs, and so on.

Generally, in an LED light source module, LED chips are arranged in form of matrix on a substrate. A conductive layer electrically connecting two adjacent LED chips, however, has to be arranged across active layers, doped semiconductor layers, or other structures in multi-layered LEDs. Since the conductive layer is required to be arranged across these structures in a direction perpendicular to the substrate, said arrangement may lead to breakage of the conductive layer due to the height difference and further lead to open circuits of the LEDs. As a result, the yield and reliability of the LED light source module may be reduced.

SUMMARY OF THE INVENTION

The invention is directed to a light-emitting device which ensures favorable electrical connectivity.

In an embodiment of the invention, a light-emitting device includes a plurality of light-emitting units and at least one electrical connection layer arranged between the light-emitting units. Each of the light-emitting units includes a light-emitting stacking layer, a first electrode layer, an insulation layer, and a second electrode layer. The light-emitting stacking layer includes a first-type doped semiconductor layer, a second-type doped semiconductor layer, an active layer, and at least one first inner opening. The active layer is arranged between the first-type doped semiconductor layer and the second-type doped semiconductor layer. The first inner opening passes through the second-type doped semiconductor layer and the active layer. The second electrode layer is arranged at least on a side of the light-emitting stacking layer close to the second-type doped semiconductor layer and electrically connected to the second-type doped semiconductor layer. The insulation layer is arranged at least on a sidewall of the at least one first inner opening and forms at least one second inner opening. The first electrode layer is arranged at least in the at least one second inner opening and electrically connected to the first-type doped semiconductor layer. The electrical connection layer is electrically connected to the first electrode layer of one of two light-emitting units adjacent to the electrical connection layer and electrically connected to the second electrode layer of the other of the two light-emitting units adjacent to the electrical connection layer.

According to an embodiment of the invention, the light-emitting device further includes a substrate, the light-emitting units are arranged on the substrate, and the first electrode layer of each of the light-emitting units is connected to the substrate.

According to an embodiment of the invention, the second electrode layer is further arranged on a portion of the first electrode layer, and the insulation layer is further arranged between the second electrode layer and the portion of the first electrode layer. A region of the substrate onto which the first electrode layer is projected partially overlaps a region of the substrate onto which the first electrode layer is projected.

According to an embodiment of the invention, the light-emitting device further includes a plurality of trenches arranged between the light-emitting units, and the trenches expose sidewalls of the light-emitting stacking layers.

According to an embodiment of the invention, the first electrode layers and the second electrode layers of the light-emitting units are respectively extended to adjacent trenches.

According to an embodiment of the invention, extended portions of the first electrode layer and the second electrode layer of each of the light-emitting units extending to an adjacent trench are located on one side of the light-emitting units, and the at least one electrical connection layer is located in the adjacent trench.

According to an embodiment of the invention, a region of the substrate onto which the electrical connection layer is projected does not overlap a region of the substrate onto which the light-emitting stacking layer is projected.

According to an embodiment of the invention, the trenches expose the active layers of adjacent light-emitting units.

According to an embodiment of the invention, the light-emitting device further includes at least one first through hole, at least one second through hole, at least one first conductive portion, and at least one second conductive portion. The first through hole passes through the substrate, the first conductive portion is arranged in the first through hole and electrically connected to the first electrode layer, the second through hole at least passes through the substrate, and the second conductive portion is arranged in the second through hole and electrically connected to the second electrode layer.

According to an embodiment of the invention, the substrate further includes a plurality of first pads and a plurality of second pads, each of the first pads is electrically connected to the at least one first conductive portion arranged in the at least one first through hole, and each of the second pads is electrically connected to the at least one second conductive portion arranged in the at least one second through hole.

According to an embodiment of the invention, the substrate is an insulation substrate.

According to an embodiment of the invention, the at least one first inner opening is a plurality of through holes.

According to an embodiment of the invention, the at least one first inner opening is a plurality of bar-shaped holes.

According to an embodiment of the invention, the bar-shaped openings communicate with each other.

In light of the foregoing, the arrangement of the first and second inner openings and the insulation layer allows the first electrode layer and the second electrode layer to be electrically connected to each other with ease through the electrical connection layer.

Several exemplary embodiments accompanied with figures are described in detail below to further describe the invention in details.

DETAILED DESCRIPTION OF DISCLOSED EMBODIMENTS

Figure 1A:
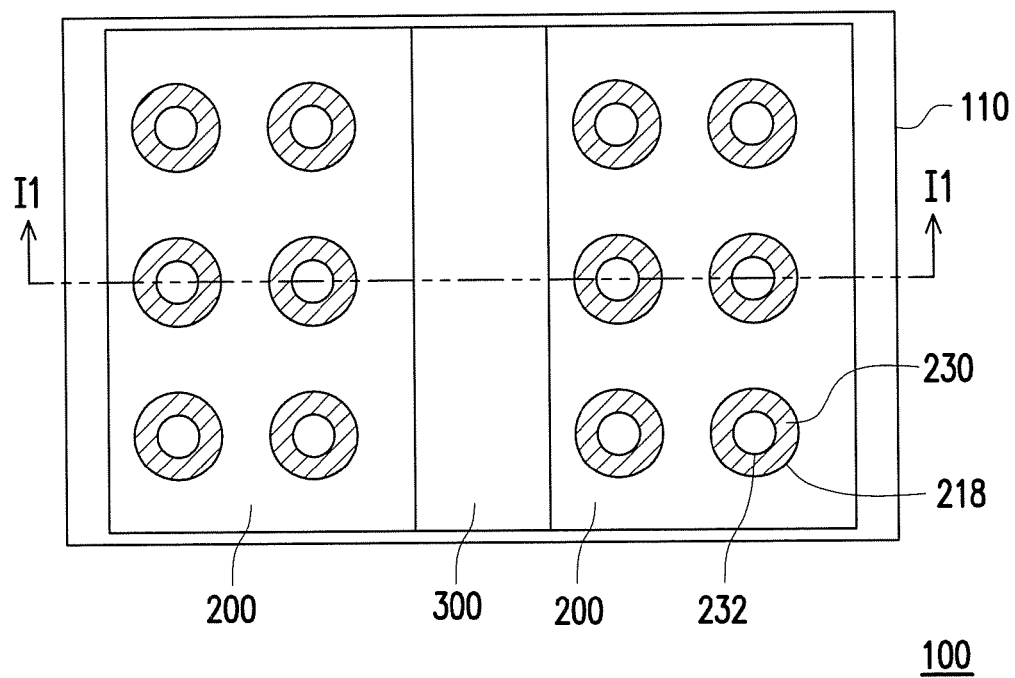
FIG. 1A is a top view of a light-emitting device according to a first embodiment of the invention.
Figure 1B:
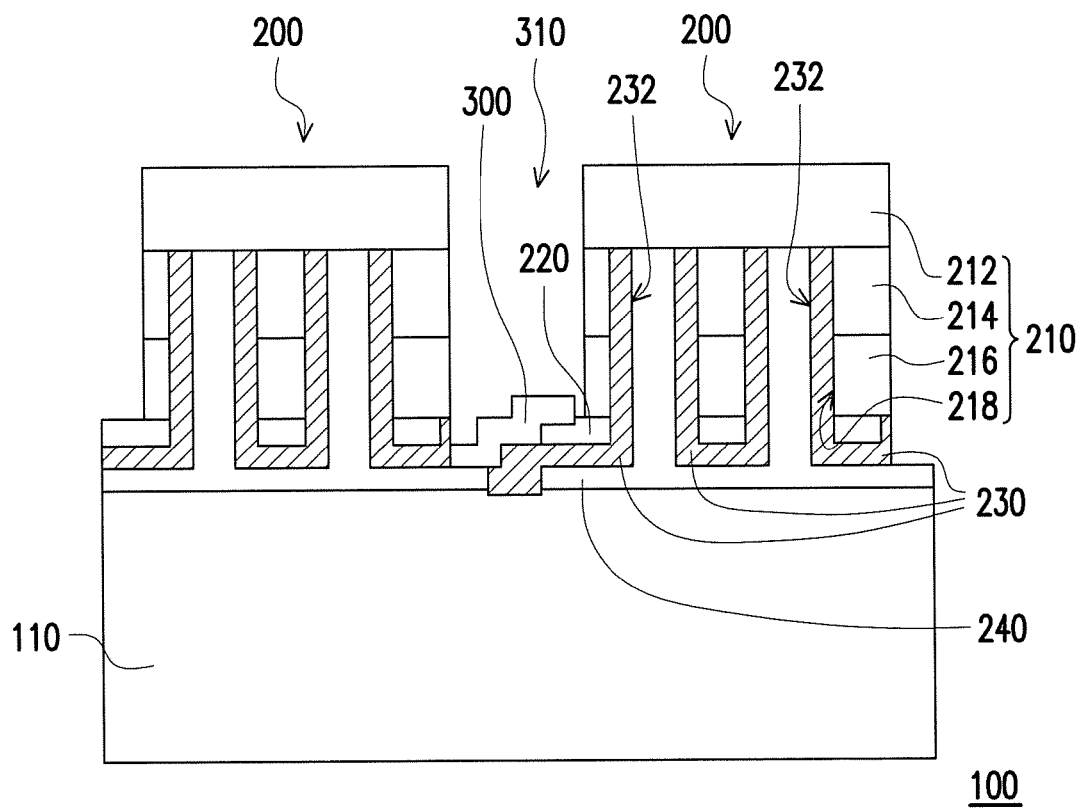
FIG. 1B is a schematic cross-sectional view taken along a section line I1-I1 depicted in FIG. 1A.

FIG. 1A is a top view of a light-emitting device according to a first embodiment of the invention. FIG. 1B is a schematic cross-sectional view taken along a section line I1-I1 depicted in FIG. 1A. To clearly explain the structure of the light-emitting device provided herein, a first-type doped semiconductor layer of the light-emitting device is not depicted in FIG. 1A, which should however not be construed as a limitation to the invention. With reference to FIG. 1A and FIG. 1B, in the first embodiment of the invention, a light-emitting device 100 includes a plurality of light-emitting units 200 and at least one electrical connection layer 300 arranged between the light-emitting units 200. Each of the light-emitting units 200 includes a light-emitting stacking layer 210, a first electrode layer 240, a second electrode layer 220, and an insulation layer 230. The light-emitting stacking layer 210 includes a first-type doped semiconductor layer 212, an active layer 214, a second-type doped semiconductor layer 216, and at least one first inner opening 218. Here, the active layer 214 is arranged between the first-type doped semiconductor layer 212 and the second-type doped semiconductor layer 216. The at least one first inner opening 218 passes through the second-type doped semiconductor layer 216 and the active layer 214.

In the present embodiment, the second electrode layer 220 is arranged on a side of the light-emitting stacking layer 210 and electrically connected to the second-type doped semiconductor layer 216. The insulation layer 230 is arranged at least on a sidewall of the first inner opening 218 and forms at least one second inner opening 232, and the first electrode layer 240 is arranged in the second inner opening 232 and electrically connected to the first-type doped semiconductor layer 212. Here, the electrical connection layer 300 is electrically connected to the first electrode layer 240 of one of two light-emitting units 200 adjacent to the electrical connection layer 300 and electrically connected to the second electrode layer 220 of the other of the light-emitting units 200 adjacent to the electrical connection layer 300.

In the present embodiment, the second electrode layer 220 of each light-emitting unit 200 in the light-emitting device 100 can be electrically connected to the second-type doped semiconductor layer 216 through the at least one second inner opening 232, and the first electrode layer 240 and the second electrode layer 220 can be electrically connected to each other at the same side of the light-emitting units 200 through the electrical connection layer 300. Owing to the arrangement of the first and second inner openings 218 and 232 as well as the first and second electrode layers 240 and 220, if two light-emitting units 200 are electrically connected to each other at the same side of the light-emitting units 200 through the electrical connection layer 300, the electrical connection layer 300 can prevent the open circuits caused by height difference, and the overall electrical connection can remain stable.

With reference to FIG. 1A and FIG. 1B, in the present embodiment, a light-emitting device 100 includes a substrate 110, and the light-emitting units 200 are arranged on the substrate 110. The substrate 110 is an insulation substrate made of sapphire, aluminum nitride (AlN), transparent glass, or any other insulation material; preferably, resistivity of the insulation material is greater than or equal to $10^3$ Ω·cm; however, the invention is not limited thereto. The first electrode layer 240 of each light-emitting unit 200 is connected to the substrate 110, the second electrode layer 220 is arranged on a portion of the first electrode layer 240, and the insulation layer 230 is further arranged between the second electrode layer 220 and the portion of the first electrode layer 240. A region of the substrate 110 onto which the first electrode layer 240 is projected partially overlaps a region of the substrate 110 onto which the second electrode layer 220 is projected. Therefore, the first electrode layer 240 and the second electrode layer 220 are electrically insulated from each other; the first-type doped semiconductor layer 212 can be electrically connected to other devices outside the light-emitting units 200 through the first electrode layer 240.

With reference to FIG. 1A and FIG. 1B, in the present embodiment, the light-emitting device 100 further includes a plurality of trenches 310 arranged between the light-emitting units 200. The trenches 310 expose sidewalls of the light-emitting stacking layers 210. Particularly, the trenches 310 expose the active layers 214 of the adjacent light-emitting units 200, so as to prevent light from being blocked and to enhance side-light emission. The first electrode layer 240 and the second electrode layer 220 of the light-emitting units 200 are respectively extended to adjacent trenches 310; that is, the extended first and second electrode layers 240 and 220 are located on the same side of the light-emitting units 200. Hence, the electrical connection layer 300 can be arranged in parts of the trenches 310, such that two adjacent light-emitting units 200 are electrically connected to each other. Particularly, according to an embodiment of the invention, a region of the substrate 110 onto which the electrical connection layer 300 is projected does not overlap a region of the substrate 110 onto which the light-emitting stacking layer 210 is projected. In other words, as long as the electrical connection layer 300 covers the bottom of the trenches 310, two light-emitting units 200 can be electrically connected to each other, and the electrical connection layer 300 need not be arranged across the active layer 214 or the sidewall of the first-type doped semiconductor layer 212, for instance. Therefore, open circuits caused by height difference resulting from the perpendicular arrangement of the electrical connection layer can be avoided, and favorable electrical connectivity can be ensured.

Figure 2:
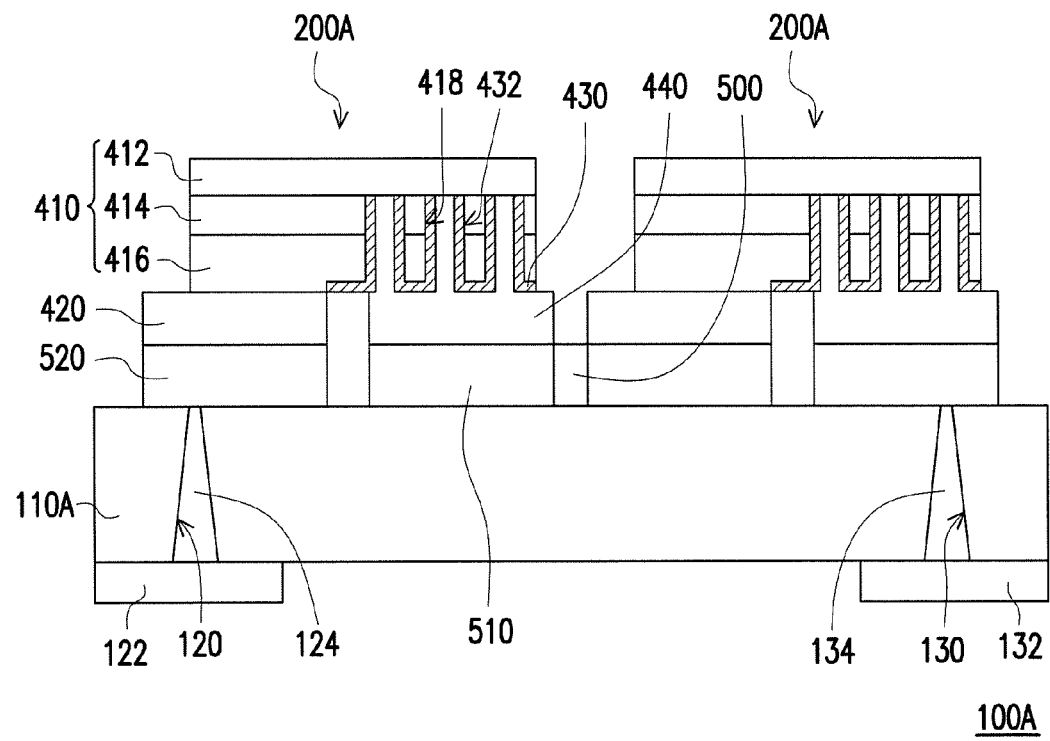
FIG. 2 is a schematic cross-sectional view of a light-emitting device according to a second embodiment of the invention.

FIG. 2 is a schematic cross-sectional view of a light-emitting device according to a second embodiment of the invention. With reference to FIG. 2, the first inner opening 418 provided in the second embodiment is similar to the first inner opening 218 provided in the first embodiment. The light-emitting unit 200A includes a light-emitting stacking layer 410. Here, the first inner opening 418 passes through the active layer 414 and the second-type doped semiconductor layer 416, and the second inner opening 432 formed by the first inner opening 418 and the insulation layer 430 allows the first electrode layer 440 to be electrically connected to the first-type doped semiconductor layer 412. According to the present embodiment of the invention, the first electrode layer 440 and the second electrode layer 420 are respectively arranged on different regions of the substrate 110A, and the light-emitting device 100A further includes at least one first through hole 130, at least one second through hole 120, at least one first conductive portion 134, and at least one second conductive portion 124. The at least one first through hole 130 passes through the substrate 110A, the first conductive portion 134 is arranged in the at least one first through hole 130 and electrically connected to the first electrode layer 440, the at least one second through hole 120 at least passes through the substrate 110A, and the second conductive portion 124 is arranged in the at least one second through hole 120 and electrically connected to the second electrode layer 420.

In the present embodiment of the invention, the substrate 110A further includes a plurality of first pads 132 and a plurality of second pads 122, each of the first pads 132 is electrically connected to the first conductive portion 134 arranged in the first through hole 130, and each of the second pads 122 is electrically connected to the second conductive portion 124 arranged in the second through hole 120. The light-emitting units 200A can be connected to the pads 510 and 520 and thereby further connected to the substrate 110A. It can be deduced from the above that the first pads 132 provided in the second embodiment of the invention are electrically connected to the first electrode layer 440 of one of the adjacent light-emitting units 200A, the second pads 122 provided in the second embodiment of the invention are electrically connected to the second electrode layer 420 of the other adjacent light-emitting unit 200A, and the two light-emitting units 200A are then electrically connected to each other through the electrical connection layer 500. Thereby, the two light-emitting units 200A are serially connected. Hence, the electrical connection layer 500 of the light-emitting device 100A provided herein need not be arranged across the perpendicular sidewall, and favorable electrical connectivity can be further guaranteed.

In the present embodiment, the electrical connection layer 500 may be selectively arranged between the two light-emitting units 200A based on actual demands, and the structure between the two or more light-emitting units 200A can be alternatively cut; through the cutting process, whether the electrical connection is serial connection or parallel connection can be defined. Accordingly, favorable electrical connectivity of the light-emitting device can be ensured, and such design of electrical connection can become more flexible.

Figure 3:
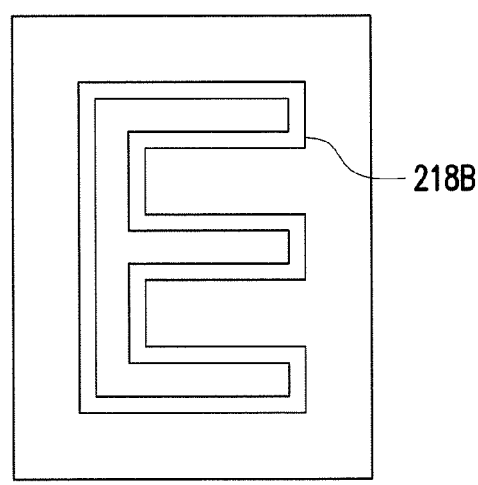
FIG. 3 is a top view of a light-emitting device according to another embodiment of the invention.

FIG. 3 is a top view of a light-emitting device according to another embodiment of the invention. Similarly, to clearly explain the structure of the light-emitting device provided herein, the first-type doped semiconductor layer of the light-emitting device is not depicted in FIG. 3, which should however not be construed as a limitation to the invention. With reference to FIG. 1A and FIG. 3, in the first embodiment of the invention, the first inner openings 218 of the light-emitting units 200 are through holes, for instance, and six round through holes are exemplarily illustrated in FIG. 1A. However, in another embodiment as shown in FIG. 3, the first inner openings 218B of the light-emitting units 200B may be bar-shaped openings communicated with each other, and the invention should not be limited thereto. According to other embodiments, the first inner openings may be separated bar-shaped openings or through holes in another shape in view of actual demands.

In an present embodiment of the invention, the first-type doped semiconductor layer is an n-type doped semiconductor layer, the second-type doped semiconductor layer is a p-type doped semiconductor layer, and the active layer is a multi-quantum well (MQW), for instance; however, the invention is not limited thereto.

To sum up, through the arrangement of the at least one first inner opening and the insulation layer, the second electrode layer of the light-emitting device provided herein is allowed to be electrically connected to the first-type doped semiconductor layer through the at least one first inner opening, and the first and second electrode layers are allowed to be extended from the same side of the light-emitting units. Accordingly, the electrical connection layer can be arranged between two to-be-electrically-connected light-emitting units in a stable manner, the electrical connectivity of the light-emitting units can be improved, and such design of electrical connection can become more feasible.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A light-emitting device comprising a plurality of light-emitting units and at least one electrical connection layer arranged between the light-emitting units, each of the light-emitting units comprising:
  a light-emitting stacking layer comprising:
    a first-type doped semiconductor layer;
    a second-type doped semiconductor layer;
    an active layer arranged between the first-type doped semiconductor layer and the second-type doped semiconductor layer; and
    at least one first inner opening passing through the second-type doped semiconductor layer and the active layer;
  a first electrode layer;
  an insulation layer;
  a second electrode layer arranged at least on a side of the light-emitting stacking layer close to the second-type doped semiconductor layer and electrically connected to the second-type doped semiconductor layer, the insulation layer being arranged at least on a sidewall of the at least one first inner opening and forming at least one second inner opening, the first electrode layer being arranged at least in the at least one second inner opening and electrically connected to the first-type doped semiconductor layer;
  a substrate, the light-emitting units being arranged on the substrate;
  a first electrode pad directly disposed on the substrate and beneath the first electrode layer of each of the light-emitting units; and
  a second electrode pad directly disposed on the substrate and beneath the second electrode layer of each of the light-emitting units;
  wherein the at least one electrical connection layer is electrically connected to the first electrode layer of one of two light-emitting units adjacent to the at least one electrical connection layer through the first electrode pad and electrically connected to the second electrode layer of the other one of the two light-emitting units adjacent to the at least one electrical connection layer through the second electrode pad, so that the light-emitting units are electrically connected to each other through the at least one electrical connection layer, wherein the first electrode layer of each of the light-emitting units is connected to the substrate, wherein the light-emitting device further comprises at least one first through hole, at least one second through hole, at least one first conductive portion, and at least one second conductive portion, the at least one first through hole passes through the substrate, the at least one first conductive portion is arranged in the at least one first through hole and electrically connected to the first electrode layer, the at least one second through hole passes through the substrate, the at least one second conductive portion is arranged in the at least one second through hole and electrically connected to the second electrode layer, and wherein the substrate further comprises a plurality of first pads and a plurality of second pads, each of the first pads is electrically connected to the at least one first conductive portion arranged in the at least one first through hole, and each of the second pads is electrically connected to the at least one second conductive portion arranged in the at least one second through hole.

2. The light-emitting device according to claim 1, further comprising a plurality of trenches arranged between the light-emitting units, the trenches exposing sidewalls of the light-emitting stacking layers.

3. The light-emitting device according to claim 2, wherein the first electrode layers and the second electrode layers of the light-emitting units are respectively extended to adjacent trenches.

4. The light-emitting device according to claim 3, wherein extended portions of the first electrode layer and the second electrode layer of each of the light-emitting units which extend to the adjacent trench are located on one side of the light-emitting units, and the at least one electrical connection layer is located in the adjacent trench.

5. The light-emitting device according to claim 4, wherein a region of the substrate onto which the at least one electrical connection layer is projected does not overlap a region of the substrate onto which the light-emitting stacking layer is projected.

6. The light-emitting device according to claim 2, wherein the trenches expose the active layers of adjacent light-emitting units.

7. The light-emitting device according to claim 1, wherein the substrate is an insulation substrate.

8. The light-emitting device according to claim 1, wherein the at least one first inner opening is a plurality of through holes.

9. The light-emitting device according to claim 1, wherein the at least one first inner opening is a plurality of bar-shaped openings.

10. The light-emitting device according to claim 9, wherein the bar-shaped openings communicate with each other.

11. The light-emitting device according to claim 1, wherein orthogonal projections of the first electrode layer and the second electrode layer of each of the light-emitting units and the at least one electrical connection layer onto the substrate are not overlapped.

* * * * *